United States Patent [19]

Fujimura et al.

[11] Patent Number: 4,512,868

[45] Date of Patent: Apr. 23, 1985

[54] MICROWAVE PLASMA PROCESSING APPARATUS

[75] Inventors: Shuzo Fujimura, Tokyo; Hiroshi Yano, Yokohama, both of Japan

[73] Assignee: Fujitsu Limited, Kawasaki, Japan

[21] Appl. No.: 628,863

[22] Filed: Jul. 9, 1984

[30] Foreign Application Priority Data

Jul. 8, 1983 [JP] Japan ............................. 58-124511

[51] Int. Cl.$^3$ ............................................. C23C 15/00
[52] U.S. Cl. ................................. 204/298; 156/345; 156/643; 156/646; 156/657; 204/192 R; 204/192 E
[58] Field of Search ............... 156/646, 345, 643; 204/298, 192 E

[56] References Cited

U.S. PATENT DOCUMENTS

| | | | |
|---|---|---|---|
| 4,192,706 | 3/1980 | Horiike | 156/646 |
| 4,265,730 | 5/1981 | Hirose et al. | 204/298 |
| 4,298,419 | 11/1981 | Suzuki et al. | 204/298 |
| 4,430,138 | 2/1984 | Suzuki et al. | 156/345 |
| 4,462,863 | 7/1984 | Nishimatsu et al. | 156/646 |

Primary Examiner—Arthur P. Demers

Attorney, Agent, or Firm—Armstrong, Nikaido, Marmelstein & Kubovcik

[57] ABSTRACT

A microwave plasma processing apparatus for dry etching or ashing in a fabricating process for an integrated circuit semiconductor device is improved to provide a higher processing rate. The apparatus comprises a plasma generating region formed in a part of a waveguide through which microwave power is transmitted. A reactive gas is introduced into the plasma generating region and a plasma is generated by the microwave power applied thereto. A reacting region is coupled to the plasma generating region through a shielding member, wherein radicals of the reactive gas generated in the plasma enter the reacting region through the shielding member. The plasma generating region, the reacting region and an evacuating device comprise a vacuum system and establish a fixed gas pressure for the reactive gas. The radicals (active species) react with an object placed in the reacting region, forming volatile compounds which are removed by the evacuating device. The plasma is confined in the plasma generating region by the shielding means, thereby preventing damage of the object due to the plasma.

8 Claims, 9 Drawing Figures

*Fig.1(a)*
*Fig.1(b)*
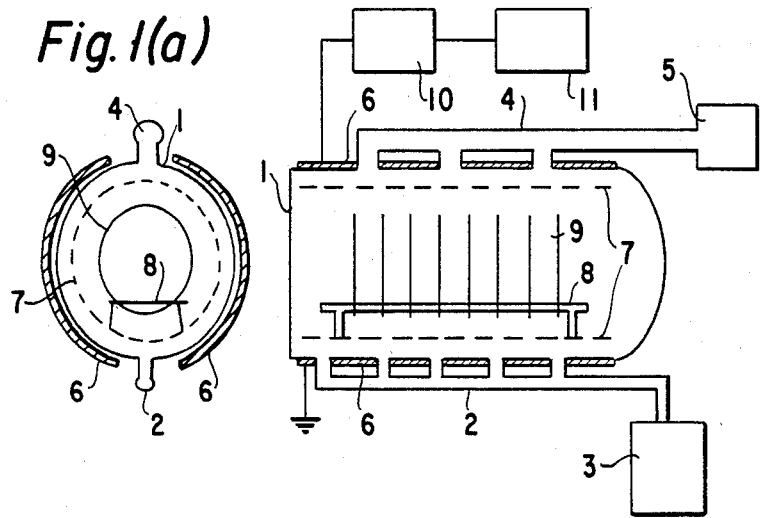
*Fig.2*
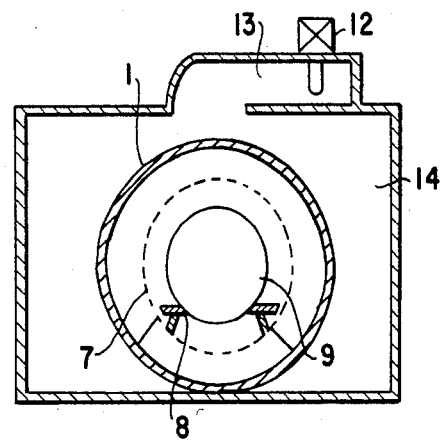

MICROWAVE PLASMA PROCESSING APPARATUS

BACKGROUND OF THE INVENTION

1. Field of the Invention

The present invention relates to a plasma processing apparatus used for the fabrication of an integrated circuit semiconductor (IC). More particularly, the present invention relates to a microwave plasma processor used for an etching or ashing process in the fabricating process of an IC, the plasma processor having an improved, high processing rate.

2. Description of the Prior Art

In a process for forming fine patterns in an IC device, an etching method and an "ashing" method are used; a process for etching off the protective layers of silicon, silicon dioxide, or silicon nitride on wafer surfaces, and a process for removing, or "ashing", a photoresist mask, which is usually an organic layer. From the beginning of the IC industry, a wet etching method has been employed utilizing sulfuric, hydrochloric, or phosphoric acids, but recently the wet etching method has been replaced by a dry etching method, such as a plasma etching method, for example. A plasma etching process has various advantages as compared with a wet etching method, such as capability for fine resolution and less under cutting, reduction of the number of fabricating processes such as elimination of wafer handling for rinsing and drying, inherent cleanness and the like. Plasma etching, in particular, makes it possible to perform sequential etching and stripping operations on the same machine, making it possible to have a fully automated fabricating process for an IC.

A plasma is a highly ionized gas with a nearly equal number of positive and negative charged particles plus free radicals. The free radicals are electrically neutral atoms or molecules that can actively form chemical bonding. The free radicals generated in a plasma, acting as a reactive species, chemically combine with materials to be etched, to form volatile compounds which are removed from the system by an evacuating device. Therefore, a plasma etching apparatus comprises essentially a plasma generating region, a reacting region (reactor) and an evacuating device.

Generally, an IC device exposed in a plasma environment is damaged by ion bombardment, radiation of ultraviolet rays, soft X-rays and the like, so the IC device should be shielded from the plasma. A plasma is generated in a gas of approximately 0.5 to 2 Torr by the application of microwave energy supplied by a radio frequency (RF) generator or microwave source to the gas. The generating efficiency of the plasma, or of chemical radicals contained in the plasma, is an important factor in plasma processing. The radical generated in a plasma are introduced into a reactor (reacting region) for reacting with a material to be worked. Unfortunately, the radicals probably collide with other gas molecules or wall surfaces thereby being recombined and losing their chemical activity. It is very important to reduce the recombination of the radicals. Taking the above into cnsideration, plasma etching apparatuses of various types has been developed.

FIGS. 1(a) and (b) are respectively schematic lateral and longitudinal cross-sectional views of a condenser type plasma etching apparatus having an etch-tunnel, which are set forth in Japanese patent application No. 44449/80 and Japanese patent application No. 22373/76. An etching gas is supplied from a source 3 into a reactor 1 through a feeding tube 2. RF energy from an oscillator 11 and tuning circuit 10 having a RF (radio frequency) of 13.56 MHZ is applied to the gas through electrodes 6, and the gas is ionized, generating a plasma in the space between the co-cylindrical reactor 1 and an etching tunnel 7. Chemical active species (hereinafter referred to simply as radicals) are generated in the plasma and move through the pores provided on the wall of the etching tunnel 7. The radicals reaching the surface of the wafer 9 positioned inside the etching tunnel 7 react with the material on the wafer 9 forming volatile compounds which are removed from the system with a vacuum pumping device 5 through an exhaust tube 4. Thus, the material on the wafer is etched or ashed. In this apparatus, the reacting region and the plasma generating region are positioned in the same vessel, the reactor 1. The wafer 9 is thus shielded and protected from the plasma by the etching tunnel 7.

FIG. 2 is a schematic cross-sectional view of a plasma etching apparatus utilizing microwave energy of a frequency 2.45 GHz, for generating a plasma. Microwave energy generated by a magnetron 12 is transmitted into a metallic oven 14 through a waveguide 13. An etching tunnel 7 positioned inside the metallic oven 14 plays the same role as that shown in FIG. 1. However, unlike the case of a radio frequency of 13.56 MHz, a stable plasma is not obtained because of an unstable discharging condition derived from the short wavelength of the microwave as compared with the dimensions of the reactor (metallic oven 14). In addition, the microwave field intensity differs from location to location resulting in the generation of a nonuniformly distributed plasma. As a result, the generating efficiency of radicals decreases and the rate of plasma processing efficiency such as etching or ashing drops significantly. As one of the countermeasures to this problem, it is desirable that the metallic oven 14 itself might act as a microwave resonator, but this is almost impossible because various metallic devices, such as etching tunnel 7, are placed inside the metallic oven 14, and the amount of wafers to be processed varies from batch to batch.

In order to eliminate the above described problem, a chemical dry etching apparatus is used which has a plasma generating vessel (plasma generating region) and a reactor (reacting region) spaced apart from each other and connected through a tube to guide radicals from the plasma generating vessel to the reactor. This is set forth in Japanese Patent TOKU-KO-SHO 53-14472 or U.S. Pat. No. 4,192,706, 1980, by HORIIKE and illustrated in FIG. 3 of this application in a cross-sectional view schematically.

Referring to FIG. 3, the microwave energy supplying device comprises a magnetron power source 12, a waveguide 16, a tunel 17, a plunger 18, an applicator 19, microwave shield housing 20 and plasma generating vessel 21. The description of each elements is omitted because they are easily understood by those skilled in the art. A reactor 1 is positioned remote from the plasma generating vessel 21 by a specified distance L. This spatial separation makes it easy to obtain a matching between the load impedance (plasma 22) and the output impedance of the microwave source 12 (a magnetron) at the frequency of 2.45 MHz so that the microwave energy is absorbed effectively by gas plasma 22, and the generating efficiency of an active species (radicals) is increased significantly. The radicals thus generated are introduced into a reactor 1, where a wafer 9 or other device to be worked is positioned.

In the above method, a gas mixture of carbon tetrafluoride ($CF_4$) and oxygen ($O_2$) was used as an etching gas and the generating efficiency of the radicals was increased by covering the inside wall of the reactor 1 with a ceramic material to prevent the reduction of chemical active species.

In an ashing process of photoresist layers or other organic materials, oxygen is an effective reactive gas having a high processing rate, but its radicals generated in a plasma have a short life, which is prolonged by mixing the gas with $CF_4$ gas. As clearly seen from a curve shown in FIG. 4, which indicates the relation between the ashing rate of a photoresist film and the mixing ratio of $CF_4$ in the gas mixture, the mixing ratio, $CF_4/(O_2+CF_4)$, of 30% provides the highest ashing rate. In this condition, it has been found that almost a constant etching rate is obtained with the distance L of approximately 30 to 60 cm as shown in FIG. 5 which shows the relation between the ashing rate and the distance L.

However, in the above process there is a problem. A plasma has a different width of swell during its discharge, depending on the kind of the gas used. A plasma of a gas such as argon (Ar), boron tri-chloride ($BCl_3$), carbon tetra-fluoride ($CF_4$) or the like, having a high flow resistance, swells widely and the wafer positioned 20 cm from the waveguide, is immersed in the plasma and is damaged. On the contrary, with regard to a reactive gas of oxygen ($O_2$) or chlorine ($Cl_2$) having low flow resistance, the plasma has little swelling, and the radicals generated in the plasma fail to reach the wafer 9 because of their long travelling distance during which the radicals are recombined. Therefore, it is very difficult to determine a suitable distance L described above.

SUMMARY OF THE INVENTION

It is an object of the present invention, therefore, to provide an improved microwave plasma processing apparatus for removing the photoresist films or for etching off the protective layers in the fabricating processes of integrated circuit semiconductor devices.

It is another object of the present invention to provide an improved microwave plasma processing apparatus having a high processing rate where reactive gas of various kinds is applicable and the IC devices being processed are protected from a damage derived from the plasma.

The foregoing objects are accomplished by electrically separating the plasma generating region and the reacting region by a shielding means, and providing the apparatus with freedom of electrical design so that the plasma generating region occupies a part of the waveguide of the microwave circuit. As a result, almost all of the microwave energy is used for generating a plasma of the reactive gas. Further, the reacting region (reactor) is positioned adjoining the plasma generating region. Namely, the plasma generating region and reacting region are arranged very close together without any spacing. The reactor and the plasma generating region (a part of the waveguide) are electrically separated by a shielding plate which comprises a part of the wall of the plasma generating region, but adjoined spatialy through holes formed in the shielding plate. The shielding means for the plasma therefore acts as a transmitting means for the radicals. Thus, the chemical active species, the radicals, generated in the plasma diffuse into the reactor to reach the surface of an object such as a wafer to be etched or ashed. The travel distance of the radicals is so short that a large number of radicals can reach the surface of the object to be processed before being recombined and losing their chemical activity. As a result, the converting efficiency, namely, number of radicals reacting with the object to be processed per unit of microwave energy consumed, will rise significantly, providing the plasma processing apparatus with a high processing rate.

Now the details of the present invention are discussed below together with the accompanying drawings.

BRIEF DESCRIPTION OF THE DRAWINGS

FIG. 1(a) is a lateral cross-sectional view of a conventional condenser type plasma processing apparatus having an etch tunnel;

FIG. 1(b) is a longitudinal cross-sectional view of a conventional condenser type plasma processing apparatus having an etch tunnel;

FIG. 2 is a schematic cross-sectional view of a conventional plasma processing apparatus utilizing microwave energy;

DETAILED DESCRIPTION OF THE PREFERRED EMBODIMENTS

Before describing the preferred embodiments, it is necessary to explain in more detail about the reactive gas mixture. Reference is made to a report titled "Decapsulation And Photoresist Stripping In Oxygen Microwave Plasmas" by S. Dzioba and H. M. Naguib in J. Electrochem. Soc.; Vol. 129 No. 11, 1982. According to the report, oxygen ($O_2$) was found as a reacting gas with a processing (ashing) rate of 6 $\mu$m/min for a photoresist layer, which is significantly faster by one or two orders than that of a conventional reacting gas. Although the processing was carried out in the afterflow of the discharge, it was found that the concentration of the atomic oxygen (radicals) decays rapidly. This is because the survival probability of the atomic oxygen is very low. In order to prolong the life of oxygen radicals, a gas of $CF_4$ was added. Although the ashing rate of the mixed gas was lower than that of pure oxygen gas, the life of the radicals generated from the mixed gas was long enough to be employed for a plasma processing apparatus. An object to be processed was positioned apart from a plasma by approximately 30 cm so that damage to the object due to a plasma could be avoided.

This was the reacting gas of a conventional plasma processing apparatus as described before.

Figure 3:
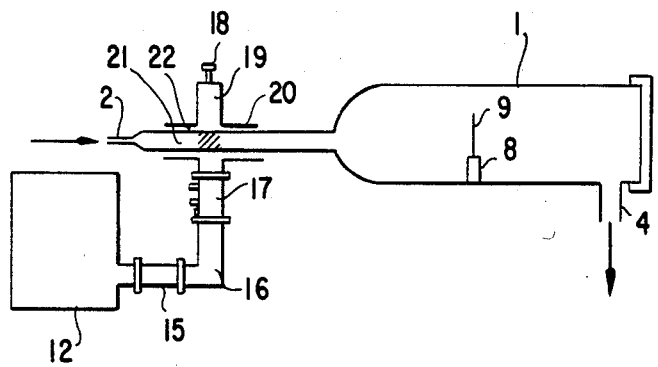
FIG. 3 is a cross-sectional view of a prior art microwave plasma etching (chemical dry etching) apparatus.
Figure 4:
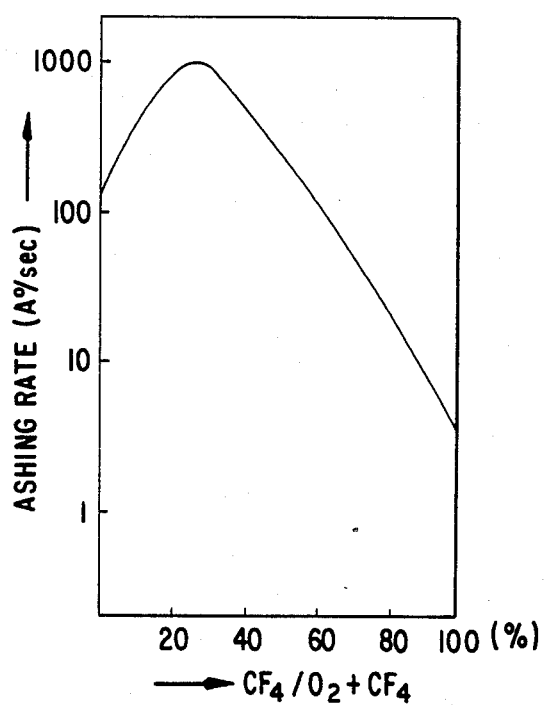
FIG. 4 illustrates graphically the relation between ashing rate and $CF_4$ concentration of a reactive gas of a $CF_4$—$O_2$ mixture, during an ashing process of a photoresist layer.
Figure 5:
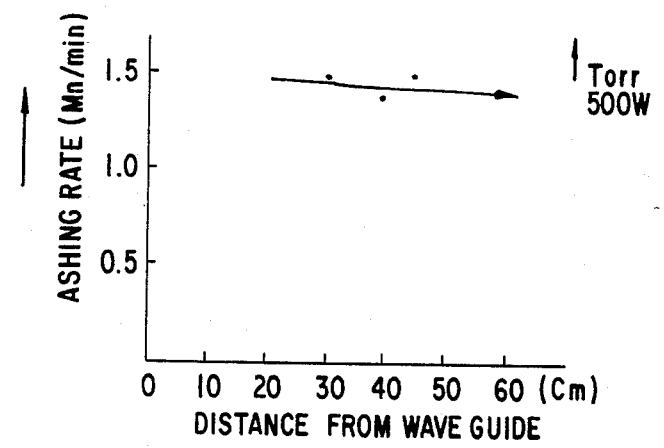
FIG. 5 illustrates graphically the relation between ashing rate and distance between a reactor and a plasma generating vessel (waveguide) obtained by the use of the apparatus shown in FIG. 3
Figure 6:
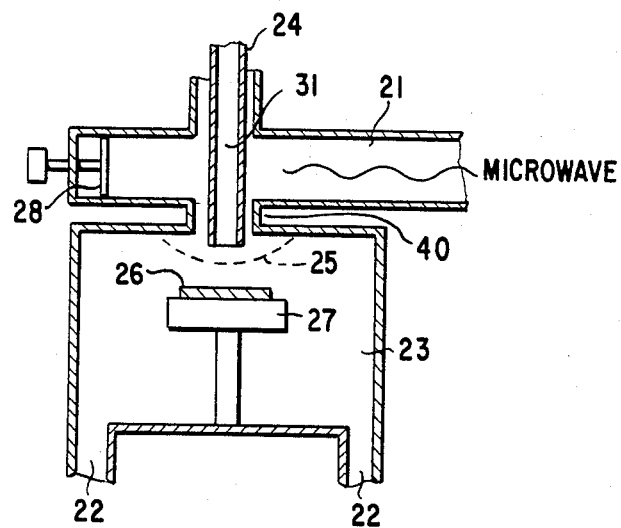
FIG. 6 is a cross-sectional view of a plasma processing apparatus for practicing the present invention.

The inventors herein considered that the processing rate could be increased by reducing the concentration of $CF_4$ gas in the gas mixture and the expected shorter life of the mixed gas radicals could be prolonged by reducing the distance (L) between the plasma and the object, and the expected damage to the object by a plasma could be avoided by creating a means to prevent the plasma from immersing the object. According to the above consideration, an experiment was performed by the inventors using an experimental apparatus, whose cross-sectional view is illustrated in FIG. 6.

The microwave energy is transmitted from a microwave power source (not shown) through a waveguide 21. A reactor of silicate glass 23 is connected to the waveguide 21 with a short connecting tube 40. A ceramic tube 24 introduces a reactive gas supplied from a gas source (not shown) into the reactor 23. The system comprising the waveguide 21, the reactor 23 and a ceramic tube 24 is sealed vacuum-tight (the sealing structure is not shown) and evacuated by a pumping device (not shown) through exhaust tubes 22 attached to the reactor 23. The ceramic tube 24 passes through the waveguide 21, so the reactive gas inside the ceramic tube 24 at this portion is ionized to form a plasma, wherein radicals are generated by the effect of microwave electric field. The radicals flow into the reactor 23, where an object 26 such as a semiconductor wafer is mounted on a platform 27. The object 26 is located near the opening of the ceramic tube 24, so the distance between the plasma and the object is small such as a few mm. This results in a short travelling path for the radicals to reach the surface of the object 26, so the survival probability of the radicals reaching the surface is significantly increased. Thus, a higher processing rate of photoresist will be obtained. A shield 25 of metallic mesh is positioned around the outside of the ceramic tube 24 in the same plane as the bottom plane of the waveguide 21. The shield 25 effectively shields the microwave electric field to prevent the plasma from surrounding the object 26.

Figure 7:
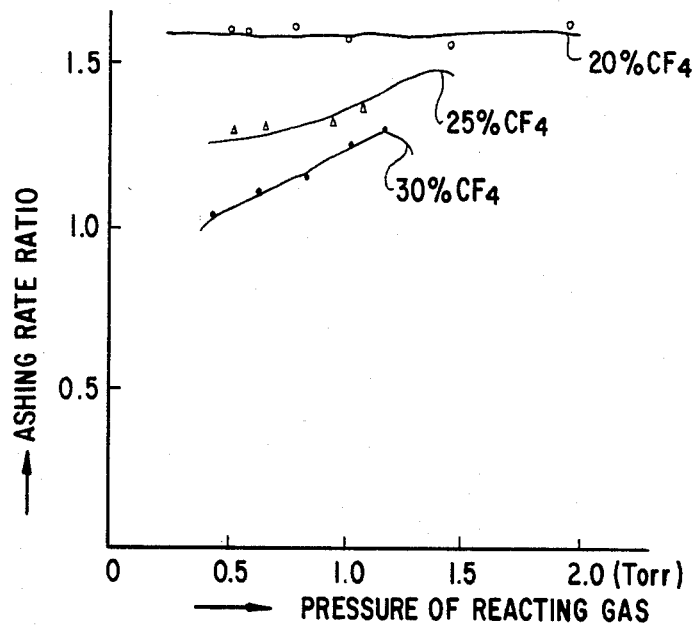
FIG. 7 illustrates graphically experimental results obtained utilizing an embodiment of the present invention, namely, the relation between ashing rate ratio and reactive gas pressure with a parameter of $CF_4$ concentration of the reactive gas of $CF_4+O_2$ mixture.

The experiment was performed for various conditions with the $CF_4$ concentration in the gas mixture of $CF_4+O_2$ as a reactive gas and with their gas pressure. The results obtained using the experimental apparatus shown in FIG. 6 is illustrated in FIG. 7. The relative ashing rate is plotted on the ordinates and the reactive gas pressure is plotted on the abscissa, taking the $CF_4$ concentration as a parameter for a fixed distance L of 20 mm. The ashing rate with a conventional plasma processing apparatus having a reactive gas mixture of $CF_4$ mixing ratio of 30%, is taken as 1. As clearly seen from the curves in FIG. 7, an increased ashing rate of approximately 1.5 times of the conventional rate is obtained with a reactive gas of 20% $CF_4$ concentration, and its dependency on the reactive gas pressure is very small at a gas pressure of 0.5 to 2 Torr. It was found that a reactive gas with lesser concentration of $CF_4$ gas provides a higher ashing rate. The experiment was performed varying the distance L from 3 to 20 mm. Throughout all the experiments, no change of the characteristics of the object 26, an IC semiconductor, which might be attributed to the damage caused by the plasma, was observed.

Figure 8:
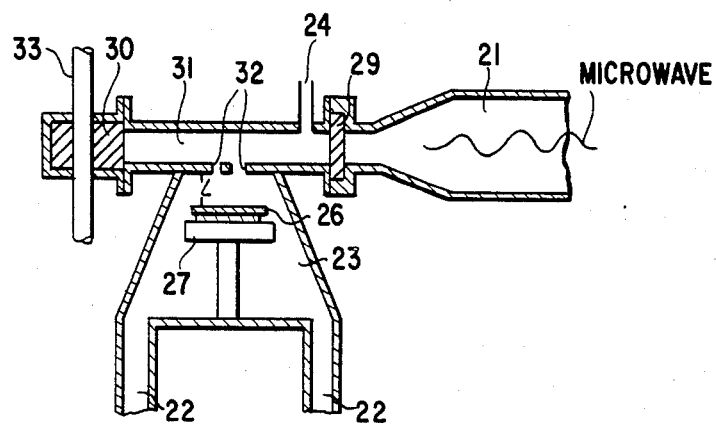
FIG. 8 is a cross-sectional view of a plasma etching apparatus embodying the present invention.

Based on the above experimental results, an improved plasma processing apparatus was developed as illustrated in FIG. 8. A schematic cross-sectional view of the apparatus is provided in the figure. This is a typical embodiment of the present invention.

Microwave energy having a frequency of 2.45 MHz, supplied from a magnetron (not shown) having a 400 W output power, is transmitted through a waveguide 21. A plasma generating vessel 31 is substantially a part of the waveguide 21 and partitioned from the other part of the waveguide 21 by a ceramic or silica glass, vacuum tight window 29. A dummy load 30 is attached to the end of the total waveguide, namely, the waveguide 21 including the plasma generating vessel 31, in order to reduce reflected microwave power. The dummy load is water-cooled by a water-cooling pipe 33. As a result, the microwave energy applied to the reactive gas is substantially a travelling wave and ionizes the gas uniformly. A processing vessel (reactor) 23 is coupled to the plasma generating vessel 31 through several holes 32 formed in a wall of the waveguide 21. The holes 32 act as a shielding means for the microwave energy to prevent the plasma generated in the vessel 31 from intruding into the processing vessel 23 thereby protecting an object positioned inside the processing vessel 23. At the same time, the holes 32 act as a transmitting means for the radicals. The plasma generating vessel 31, the processing vessel 23, and a pumping device (not shown) comprise a vacuum system, and the system is evacuated through exhaust tubes 22. A reactive gas is introduced into the plasma generating vessel 31 through a gas feeding tube 24, and ionized to form a plasma. Radicals generated in the plasma pass through the holes 32 to reach the object 26 in the processing vessel 23 and react with the object 26 forming volatile compounds which are exhausted by the vacuum pump. The distance L between the plasma generating vessel 31 and the object 26 is selected as approximately 0.8 cm. This length of 0.8 cm is equal to the distance where the plasma may intrude if the shielding means of plasma, or transmitting means for the radicals is taken away. The dimension of the plasma generating vessel 31, in the direction of the microwave electric field, is slightly reduced from that of the original waveguide 21, by 8 mm for example. The reduction in the dimension intensifies the microwave electric field inside the plasma generating vessel 31 thereby increasing the plasma generating efficiency.

Utilizing the apparatus described above, several plasma processing experiments were performed, using a reactive gas mixture of $O_2+CF_4$. The mixing ratio of $CF_4$ is 20% and its pressure inside the plasma generating vessel 31 was 0.5 Torr. The output power of the magnetron was 400 W. A number of silicon wafers of 4 inches in diameter having photoresist layers on them were processed, resulting in a higher ashing rate of 1.5 times that obtained with a conventional plasma processing apparatus. In this experimental processing, ashing of the photoresist layers was satisfactory. The photoresist material attached to a undercut portion or back side portion of the wafer under processing was completely removed. In addition, no damage to the wafer was found and the protection of the wafer was found satisfactory.

So far, several experimental results regarding the ashing of photoresist layers are described, and the plasma processing apparatus shown in FIG. 8 has proved to have a similar high processing rate for the etching of protective layers used in the IC industry such as layers of silicon, silicon dioxide, silicon nitride.

These are several alternative structures for the shielding plate or the transmitting plate of the radicals. A number of holes with small diameter are formed in the wall of the waveguide 21 where the processing vessel 23 is coupled. This wall acts as a shielding plate and also can pass the radicals from the waveguide 21 to the vessel 23. A conventional wire mesh plate is also applicable for the shielding plate. For the convenience of mounting the apparatus, a short neck flange having a metallic mesh or mesh-like metallic plate stretched across its opening may also be used. In this case, the neck of the processing vessel should be as short as possible.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

I claim:

1. A plasma processing apparatus for semiconductor substrates comprising:

a microwave power source;

a microwave transmitting means including a waveguide;

a plasma generating region defined in a part of said waveguide;

a reacting region for processing a semiconductor substrate, coupled to said plasma generating region;

a dielectric window formed in said waveguide for defining a portion of said plasma generating region, said dielectric window transmitting microwave power;

a gas inlet through which the reactive gas is fed into said plasma generating region wherein free radicals of the reactive gas are generated in the plasma; and radical transmitting means provided between said plasma generating region and said reacting region, said radical transmitting means transmitting the free radicals created in said plasma generating region into said reacting region and substantially preventing the leak of microwave energy and the plasma into the reacting region, wherein the free radicals act on the semiconductor substrate in said reacting region.

2. A plasma processing apparatus according to claim 1, including a dummy load terminating said waveguide, wherein said microwave energy which generates the plasma in said plasma generating region is substantially a travelling wave.

3. A plasma processing apparatus according to claim 1, wherein the dimension of said plasma generating region in the direction of the microwave electric field is less than that of other portions of said waveguide.

4. A plasma processing apparatus according to claim 1, wherein said reactive region is coupled to said plasma generating region through said radical transmitting means and the substrates to be processed are positioned not more than 5 cm from said radical transmitting means.

5. A plasma processing apparatus according to claim 1, wherein the material of said radical transmitting means is selected from a metallic mesh and a metallic grid.

6. A plasma processing apparatus according to claim 1, wherein the material of said dielectric window is a ceramic.

7. A plasma processing apparatus according to claim 1, wherein the reactive gas comprises a gas mixture of oxygen ($O_2$) and carbon tetra-fluoride ($CF_4$).

8. A plasma processing apparatus according to claim 1, including a ceramic layer coated on an inside wall surface of said plasma generating region.

* * * * *